United States Patent [19]

Tada et al.

[11] Patent Number: 5,019,700
[45] Date of Patent: May 28, 1991

[54] MULTIFUNCTION CARD TYPE ELECTRONIC APPARATUS

[75] Inventors: Noburu Tada, Yamatokoriyama; Tadaharu Mukai, Kitakatsuragi; Katsuhide Shino, Soraku, all of Japan

[73] Assignee: Sharp Kabushiki Kaisha, Japan

[21] Appl. No.: 438,206

[22] Filed: Nov. 20, 1989

[30] Foreign Application Priority Data

Nov. 21, 1988 [JP] Japan ............. 63-151577[U]

[51] Int. Cl.$^5$ .......................................... G06K 19/06
[52] U.S. Cl. ................................. 235/492; 235/487; 235/488; 235/441
[58] Field of Search .............. 235/441, 487, 488, 492; 361/395, 397; 174/68.1

[56] References Cited

U.S. PATENT DOCUMENTS

| | | | |
|---|---|---|---|
| 4,463,971 | 8/1984 | Hoppe et al. | 235/492 X |
| 4,841,134 | 6/1989 | Hida et al. | 235/492 X |
| 4,943,708 | 7/1990 | Simmons et al. | 235/492 |

FOREIGN PATENT DOCUMENTS

61-131186  6/1986  Japan .

Primary Examiner—Harold Pitts
Attorney, Agent, or Firm—Nixon & Vanderhye

[57] ABSTRACT

A multifunction card type electronic apparatus comprising a simple flat-shaped circuit board into which electronic components are mounted; a protective member that is disposed on at least the top surface of the circuit board except for a portion of the top surface of the circuit board on which external connection terminals are to be disposed; and a terminal board on the top surface of which the external connection terminals are disposed, the terminal board being placed and bonded onto the portion of the top surface of the circuit board by means of an electrically conductive material so that the external connection terminals are electrically connected to the circuit board, whereby the electronic apparatus is produced in a low cost, easy to produce and suited to a mass production.

4 Claims, 2 Drawing Sheets

Fig. 3
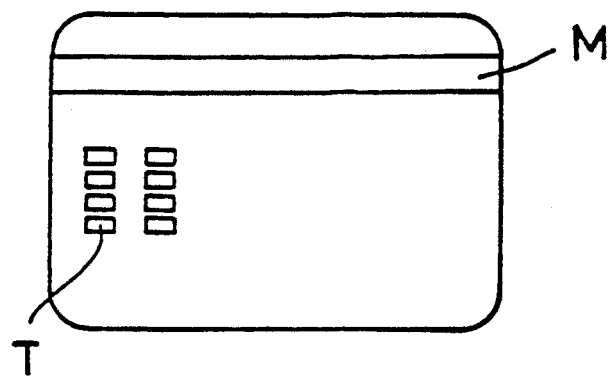
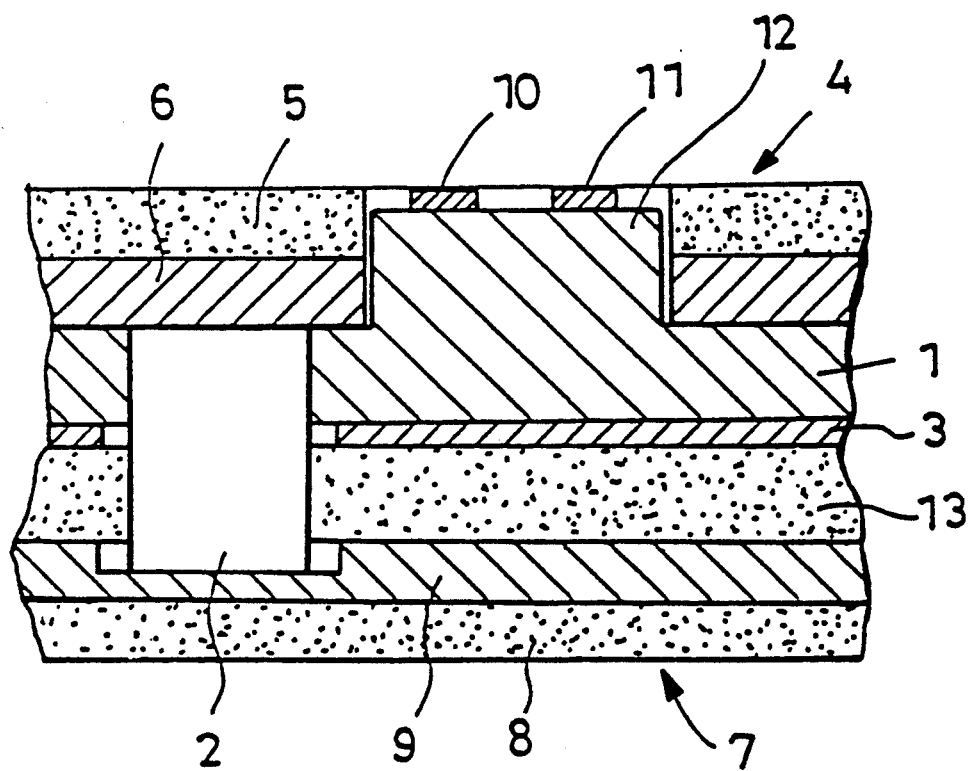
Fig. 4

MULTIFUNCTION CARD TYPE ELECTRONIC APPARATUS

BACKGROUND OF THE INVENTION

1. Field of the Invention

The present invention relates to a card type electronic apparatus with multiple functions such as card-shaped electronic calculators, electronic memo pads, IC cards or the like.

2. Description of the Prior Art

As shown in FIG. 3, a conventional ordinary card type electronic apparatus such as an IC card or the like is provided with a magnetic stripe M, formed in the direction in which it is inserted into a device where it is to be installed, and external connection terminals T for the electric connection with the device. On the other hand, a multifunction card type electronic apparatus, which is provided with data input means that are operated by means of keys, display means that are operated by means of liquid crystals or the like and a power source for these means, is known, an example of which is shown in FIG. 4, wherein various electronic components 2 such as LSIs are mounted into a main circuit board 1, on one or both surfaces of which circuit patterns 3 are disposed. Bonded onto the top surface of the circuit board 1 is a surface protection panel 4 which is composed of an outer film 5 and an inner film 6. In the same way, bonded on the back surface of the circuit board 1 by means of a spacer member 13 is a back surface protection panel 7 which is composed of an outer film 8 and an inner film 9. Electronic components 2 are protected by these protection panels 4 and 7. A lead base 12 of the circuit board 1 on which external connection terminals 10, 11 are disposed is formed with a proper thickness in such a way that when the external connection terminals 10, 11 are mounted on the lead base 12, the top surface of each of the terminals 10, 11 become approximately flush with the top surface of the protection panel 4.

The reason why the lead base 12 of the circuit board 1 on which the external connection terminals 10, are disposed is made in a larger thickness than other portions of the circuit board 1 is that the position, shape and height of the external connection terminals 10, 11 are regulated by the International Standard Organization (ISO). Particularly the height is regulated so that the difference in height between the terminals and the outer film 5 is within ±0.1 mm. In a multifunction card type electronic apparatus, however, because the surface protection panel 4 composed of the outer film 5 and the inner film 6 exists on the surface of the circuit board 1 on which the external connection terminals 10, 11 are to be disposed, the requirement for the surface unevenness to be within ±0.1 mm can by no means be satisfied when the top surface of the circuit board 1 is made flat and external connection terminals 10, 11 are provided thereon. Such a circuit board 1 with locally different thicknesses leads to higher production cost because it requires additional processes including an etching process.

SUMMARY OF THE INVENTION

The multifunction card type electronic apparatus of this invention, which overcomes the above-discussed and numerous other disadvantages and deficiencies of the prior art, comprises a simple flat-shaped circuit board into which electronic components are mounted; a protective member that is disposed on at least the top surface of said circuit board except for a portion of the top surface of said circuit board on which external connection terminals are to be disposed; and a terminal board on the top surface of which said external connection terminals are disposed, said terminal board being placed and bonded onto said portion of the top surface of said circuit board by means of an electrically conductive material so that said external connection terminals are electrically connected to said circuit board.

In a preferred embodiment, the difference in height between said external connection terminals and said protective member is within ±0.1 mm to satisfy the ISO requirement.

In a preferred embodiment, the terminal board is a double-sided wiring board or a single-sided wiring board that is provided with through-holes, an electrically conductive member that fills said through-holes electrically connecting said external connection terminals to said circuit board.

Thus, the invention described herein makes possible the objectives of:

(1) providing a multifunction card type electronic apparatus in which external connection terminals can be disposed in conformity with the ISO requirement;

(2) providing a multifunction card type electronic apparatus that can be produced at a low cost;

(3) providing a multifunction card type electronic apparatus that is easy to produce; and (4) providing a multifunction card type electronic apparatus that is suited to mass production.

BRIEF DESCRIPTION OF THE DRAWINGS

This invention may be better understood and its numerous objects and advantages will become apparent to those skilled in the art by reference to the accompanying drawings as follows:

FIG. 3 is a plan view showing a conventional ordinary card type electronic apparatus.

FIG. 4 is a cross sectional view showing a part of a conventional multifunction card type electronic apparatus.

DESCRIPTION OF THE PREFERRED EMBODIMENTS

This invention provides a multifunction card type electronic apparatus in which external connection terminals are mounted on a terminal board that is bonded to a circuit board by means of an electrically conductive material such as an electrically conductive adhesive, and the external connection terminals are electrically connected to a circuit board via the electrically conductive material. Accordingly, the external connection terminals are positioned so that the difference in height between the external connection terminals and the protective member by which the circuit board is protected can be within a tolerance of the ISO standard, even when the circuit board is formed into a simple flat sheet shape, by compensating the said height difference therebetween with the thickness of the terminal board.

Therefore, the circuit board can be formed into a flat sheet, and considerable cost reduction can be achieved.

EXAMPLE 1

Figure 1:
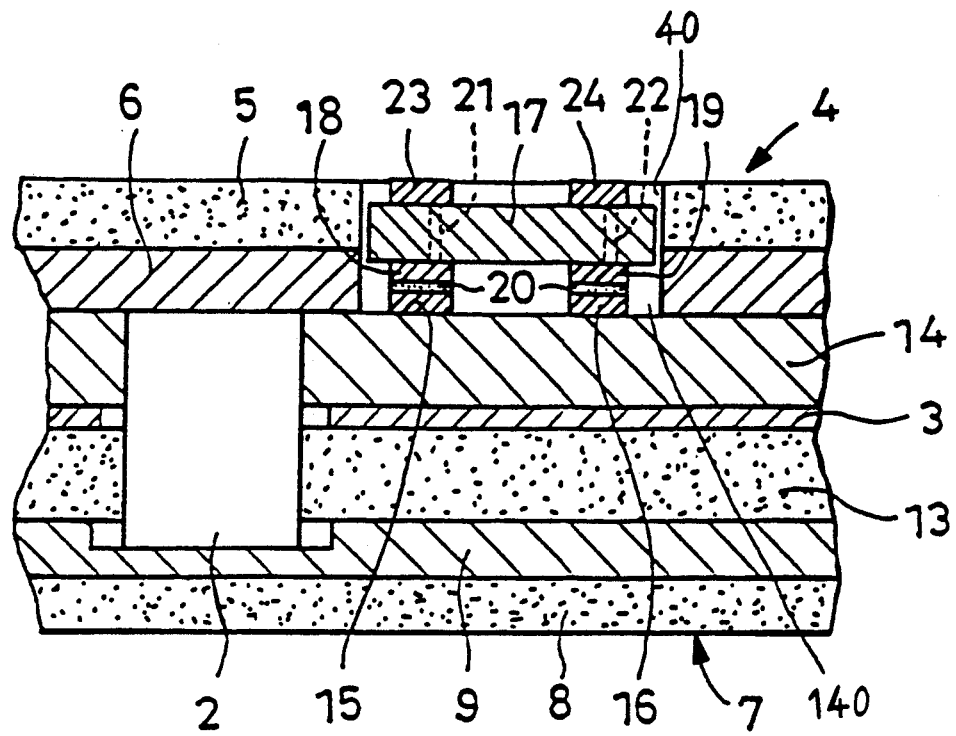
FIG. 1 is a cross sectional view showing a part of a multifunction card type electronic apparatus of this invention.

FIG. 1 shows a multifunction card type electronic apparatus of the invention, which comprises a simple flat-shaped circuit board 14 into which electronic components 2 such as LSIs or the like are mounted, and a protection panel 4 such as a surface protection panel that is disposed on at least the top surface of the circuit board 14. A hollow 40 of the protection panel 4 is formed into a hollow that corresponds to a portion 140 of the top surface of the circuit board 14 on which external connection terminals 23, 24 are to be disposed. The protection panel 4 is composed of an outer film 5 and an inner film 6. The components which are identical or equivalent with the counterparts in FIG. 4 are assigned the same reference numerals and the explanation thereof will be omitted.

On the portion 140 of the top surface of the circuit board 14, connecting parts 15, 16 are formed. A terminal board 17 that is a double-sided wiring board is inserted into the hollow 40. The terminal board 17 is provided with wiring terminals 18, 19 on the bottom surface thereof. The wiring terminals 18, 19 are electrically bonded onto the connecting parts 15, 16 on the circuit board 14 by means of an electrically conductive member 20 such as an electrically conductive adhesive or solder. The external connection terminals 23, 24 that are disposed on the terminal board 17 are composed of printed wiring terminals of the terminal board 17. These terminals 23 and 24 are electrically connected to the wiring terminals 18 and 19, respectively, by means of the through-holes 21, 22. The terminals 23 and 24 are positioned so that the difference in height between the terminals 23, 24 and the surface protection panel 4 can be within ±0.1 mm to satisfy the ISO requirement.

Therefore, even when a simple flat board is used for the circuit board 14, the top surface of each of the external connection terminals 23, 24 can be positioned within ±0.1 mm from the top surface of the surface protection panel to satisfy the ISO requirement by forming the terminal board 17 with an appropriate thickness depending upon the thickness of the surface protection panel 4. Thus significant cost reduction can be achieved compared to cases where the conventional circuit board 1 (FIG. 4) is formed in a non-flat shape as described in the prior art. In a practical production process, a dispenser and a printing technique can be adopted when an electrically conductive material is used for the electrically conductive member 20. When solder is used, on the other hand, a solder paste application process in which a dispenser, a printing technique or the like is employed or a plating process can be adopted. When the through-holes 21, 22 are left unfilled, external disturbances such as humidity, solvent or the like may enter the through-holes 21, 22. By filling these through-holes 21, 22 with a resin, reliability of the electronic apparatus under such severe environment conditions is greatly improved.

EXAMPLE 2

Figure 2:
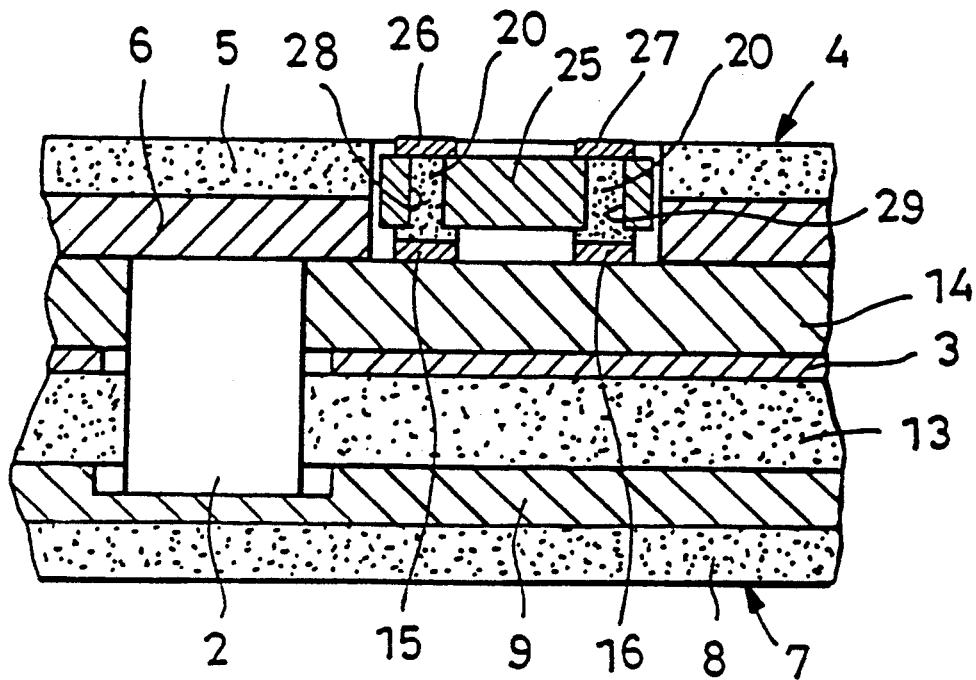
FIG. 2 is a cross sectional view showing a part of another multifunction card type electronic apparatus of this invention.

FIG. 2 shows another a multifunction card type electronic apparatus of the invention, in which the components that are identical or equivalent with the counterparts in FIG. 1 are assigned the same reference numerals and the explanation thereof will be omitted. This example is only different from that of Example 1 shown in FIG. 1 in that a single-sided wiring board is used as the terminal board 25, and that the external connection terminals 26, 27 consisting of wiring terminals provided on the single surface (top surface) are electrically connected to connecting parts 15, 16 of the circuit board 14, respectively, via electrically conductive members 20 which fill the through-holes 28, 29 of the terminal board 25 and the terminal board 25 is bonded to the circuit board 14 by means of the connecting parts 15, 16 and the conductive members 20. This example can attain the same effect as that of Example 1 shown in FIG. 1, and moreover, can attain a further cost reduction.

As described above, the card type electronic apparatus of the invention is provided with a terminal board as an auxiliary board in addition to the circuit board as the main board. By bonding the terminal board to an external connection terminal-setting section of the circuit board by means of an electrically conductive material, the external connection terminals of the terminal board are electrically connected to the circuit board via electrically conductive members. When the thickness of the terminal board is set at a certain level depending upon the thickness of the protective member, the external connection terminals can be easily positioned within the tolerable difference from the apparatus surface specified by the ISO requirement, even when the circuit board is formed into a flat shape, thereby greatly reducing the production cost of the circuit board.

Moreover, because the terminal board as the auxiliary board is bonded to the simple flat-shaped circuit board as the main board, the flat-shaped circuit board of the invention is considerably easily produced over that of the conventional single circuit board the thickness of which varies locally, so that the flat-shaped circuit board of the invention is suited to a mass production.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that enhanced reside in the present invention, including all features that would be treated as equivalents thereof by those skilled in the art to which this invention pertains.

What is claimed is:

1. A multifunction card type electronic apparatus comprising a simple flat-shaped circuit board into which electronic components are mounted; a protective member that is disposed on at least the top surface of said circuit board except for a portion of the top surface of said circuit board on which external connection terminals are to be disposed; and a terminal board on the top surface of which said external connection terminals are disposed, said terminal board being placed and bonded onto said portion of the top surface of said circuit board by means of an electrically conductive material so that said external connection terminals are electrically connected to said circuit board.

2. A multifunction card type electronic apparatus according to claim 1, wherein the difference in height between said external connection terminals and said protective member is within ±0.1 mm.

3. A multifunction card type electronic apparatus according to claim 1, wherein said terminal board is a double-sided wiring board.

4. A multifunction card type electronic apparatus according to claim 1, wherein said terminal board is a single-sided wiring board that is provided with through-holes, an electrically conductive member that fills said through-holes electrically connecting said external connection terminals to said circuit board.

* * * * *